(12) United States Patent
Kim et al.

(10) Patent No.: US 12,171,129 B2
(45) Date of Patent: Dec. 17, 2024

(54) REDLINED TITLE: DISPLAY DEVICE HAVING DISPLAY AREA INCLUDING TRANSMISSIVE AREA AND A NON-TRANSMISSIVE AREA

(71) Applicant: LG Display Co., Ltd., Seoul (KR)

(72) Inventors: Binn Kim, Paju-si (KR); Sunyoung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 447 days.

(21) Appl. No.: 17/560,094

(22) Filed: Dec. 22, 2021

(65) Prior Publication Data

US 2022/0208886 A1 Jun. 30, 2022

(30) Foreign Application Priority Data

Dec. 24, 2020 (KR) .................. 10-2020-0183512

(51) Int. Cl.
*H10K 59/35* (2023.01)
*H10K 59/121* (2023.01)
*H10K 59/131* (2023.01)

(52) U.S. Cl.
CPC ....... *H10K 59/353* (2023.02); *H10K 59/1213* (2023.02); *H10K 59/131* (2023.02); *H10K 59/351* (2023.02)

(58) Field of Classification Search
CPC ............ H10K 59/353; H10K 59/1213; H10K 59/131; H10K 59/351
USPC .......................................................... 257/40
See application file for complete search history.

(56) References Cited

U.S. PATENT DOCUMENTS

| 2011/0291550 | A1 | 12/2011 | Kim et al. |
| 2014/0138643 | A1* | 5/2014 | Choi .................... H10K 59/121 |
| | | | 257/40 |
| 2021/0091145 | A1* | 3/2021 | Huangfu ............. H10K 59/352 |

FOREIGN PATENT DOCUMENTS

KR 10-2011-0129531 A 12/2011

* cited by examiner

*Primary Examiner* — Quoc D Hoang
(74) *Attorney, Agent, or Firm* — Seed IP Law Group LLP

(57) ABSTRACT

A display device includes a substrate having transmissive areas and a non-transmissive area disposed between the transmissive areas. A first pixel is provided in the non-transmissive area, and includes a first subpixel, a second subpixel and a third subpixel. A second pixel is disposed adjacent the first pixel in the non-transmissive area, and includes a third subpixel. The first pixel and the second pixel share the first subpixel and the second subpixel.

20 Claims, 8 Drawing Sheets

REDLINED TITLE: DISPLAY DEVICE HAVING DISPLAY AREA INCLUDING TRANSMISSIVE AREA AND A NON-TRANSMISSIVE AREA

BACKGROUND

Technical Field

The present disclosure relates to a display device.

Description of the Related Art

With advancement in information-oriented societies, demands for display devices that display an image have increased in various forms. Recently, various types of display devices such as a liquid crystal display (LCD) device, a plasma display panel (PDP) device, an organic light emitting display (OLED) device and a quantum dot light emitting display (QLED) device have been widely utilized. Transparent display devices allow a user to view objects or images arranged behind the display device relative to the viewer.

A transparent display device includes a display area on which an image is displayed, and a non-display area. The display area may include a transmissive area that may transmit external light, and a non-transmissive area that blocks passage of external light therethrough. The transparent display device may have high light transmittance in the display area through the transmissive area. One method for improving transparency of a transparent display device is by increasing the ratio of transmissive area in the display area.

BRIEF SUMMARY

The inventors have realized that, for the same display area, increases in the transmissive area lead to concomitant reductions in the non-transmissive area. Signal lines and driving transistors are generally located in the non-transmissive area, and as such, reduction of the non-transmissive area increases difficulty in placement and routing of the driving transistors and signal lines. The present disclosure has been made in view of various technical problems including the above problems, and various embodiments of the present disclosure provide a display device that may improve transparency.

In addition to the technical benefits of the present disclosure as mentioned above, additional technical benefits and features of the present disclosure will be clearly understood by those skilled in the art from the following description of the present disclosure.

In accordance with an embodiment of the present disclosure, the above and other technical benefits can be accomplished by the provision of a display device comprising a substrate provided with transmissive areas and a non-transmissive area disposed between the transmissive areas, a first pixel provided in the non-transmissive, including a first subpixel, a second subpixel and a third subpixel, and a second pixel disposed to be adjacent to the first pixel in the non-transmissive area, including a first subpixel, a second subpixel and a third subpixel. The first pixel and the second pixel share the first subpixel and the second subpixel.

In accordance with another embodiment of the present disclosure, the above and other technical benefits can be accomplished by the provision of a display device comprising a substrate provided with transmissive areas and a non-transmissive area disposed between the transmissive areas, first and scan lines extended from the non-transmissive area in a first direction and spaced apart from each other with the transmissive area interposed therebetween, first and second power lines extended from the non-transmissive area in a second direction and spaced apart from each other with the transmissive area interposed therebetween, a first pixel provided in an area where the first scan line and the first power line cross each other, including first to third subpixels, and a second pixel provided in an area where the second scan line and the first power line cross each other, including first to third subpixels. The first pixel and the second pixel share one first subpixel, and share one second subpixel.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
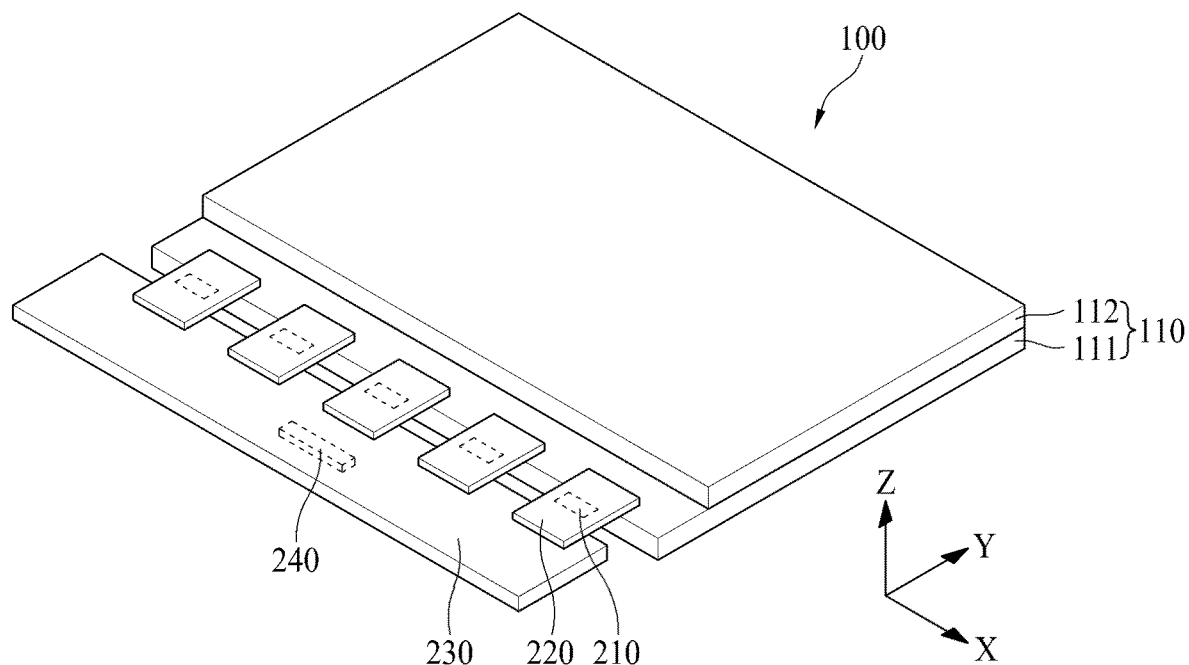
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, some known functions or configurations may be described briefly, or description thereof may be omitted for brevity, so as not to distract from technical features and technical benefits of the embodiments. In a case where 'comprise,' 'have,' and 'include' described in the present specification are used, another part may be added unless 'only' is used. Terms of a singular form may include plural forms unless described to the contrary.

In construing an element, the element is construed as including an error range even if there is no explicit description thereof.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms may be used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless otherwise mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Like reference numbers may be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a display panel 110, a source drive integrated circuit (IC) 210, a flexible film 220, a circuit board 230, and a timing controller 240.

The display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the display panel 110, or the non-display area of both peripheral sides of the display panel 110 by a gate driver in panel (GIP) method. In another way, the scan driver may be manufactured in a driving chip, may be mounted on the flexible film, and may be attached to one peripheral side or both peripheral sides of the display area of the display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
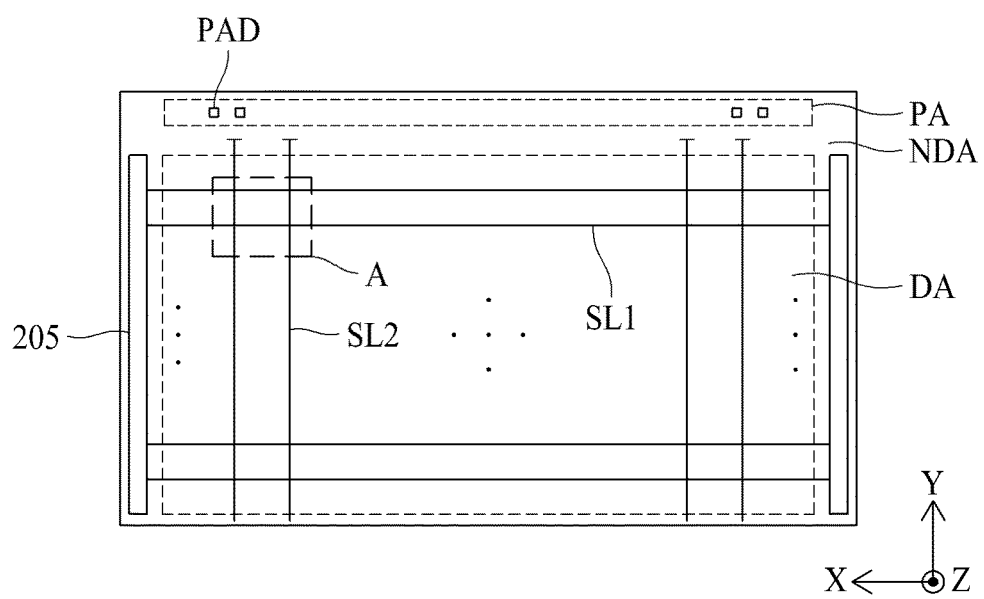
FIG. 2 is a schematic plane view illustrating a display pane according to one embodiment of the present disclosure.
Figure 3:
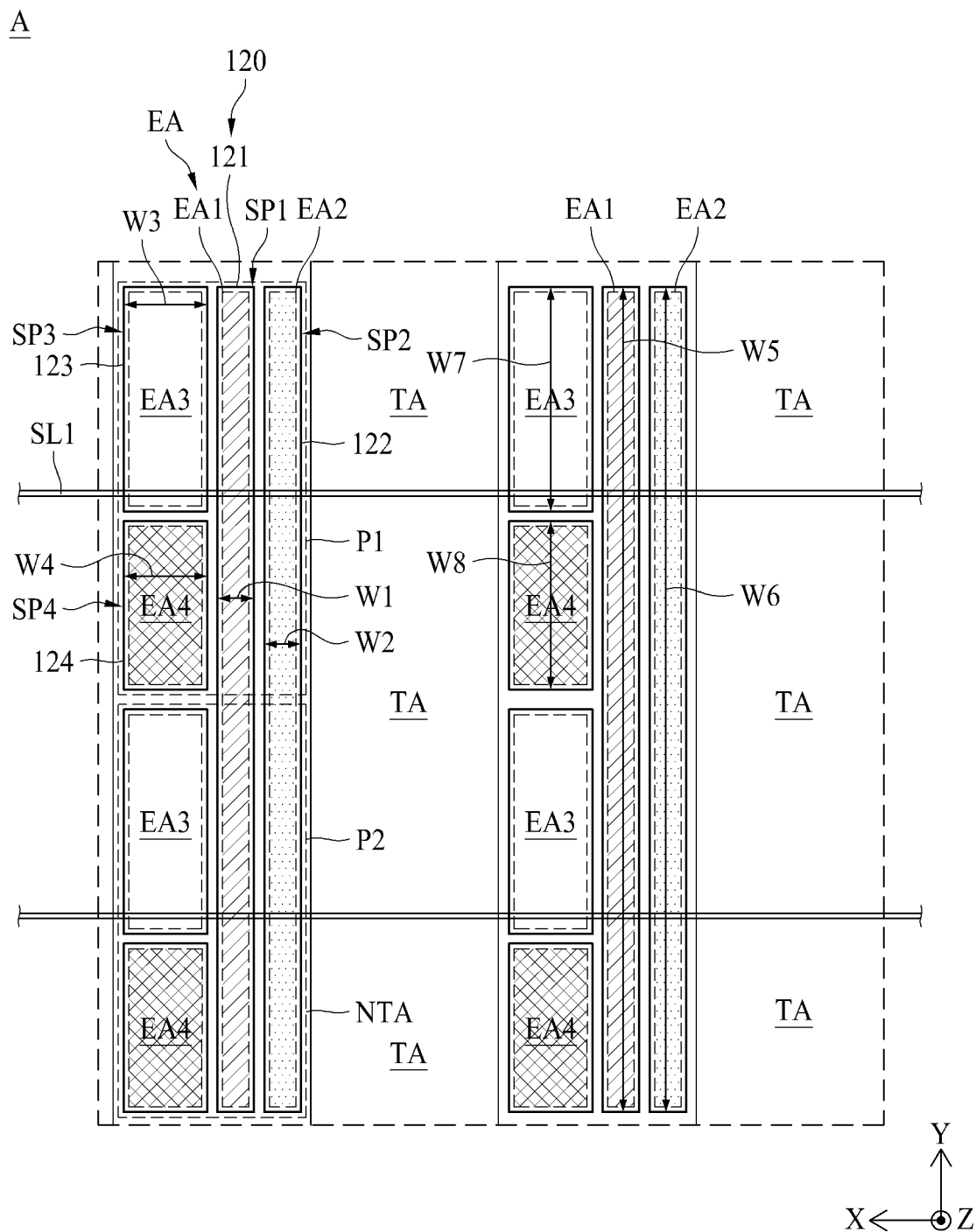
FIG. 3 is an enlarged view illustrating an area A of FIG. 2.
Figure 4:
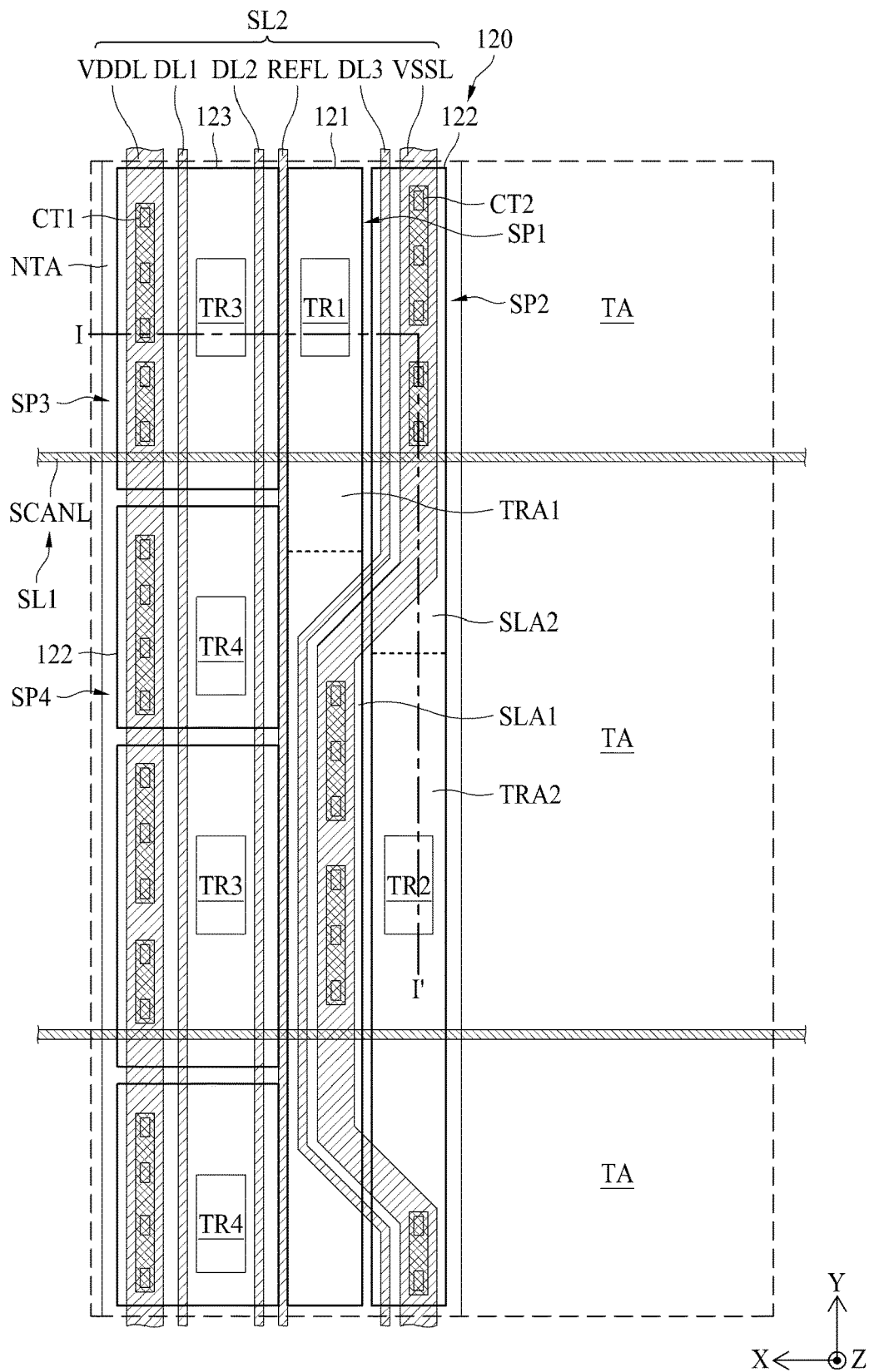
FIG. 4 is a view illustrating an example that a plurality of signal lines and a plurality of driving transistors are disposed in a pixel of FIG. 3.
Figure 5:
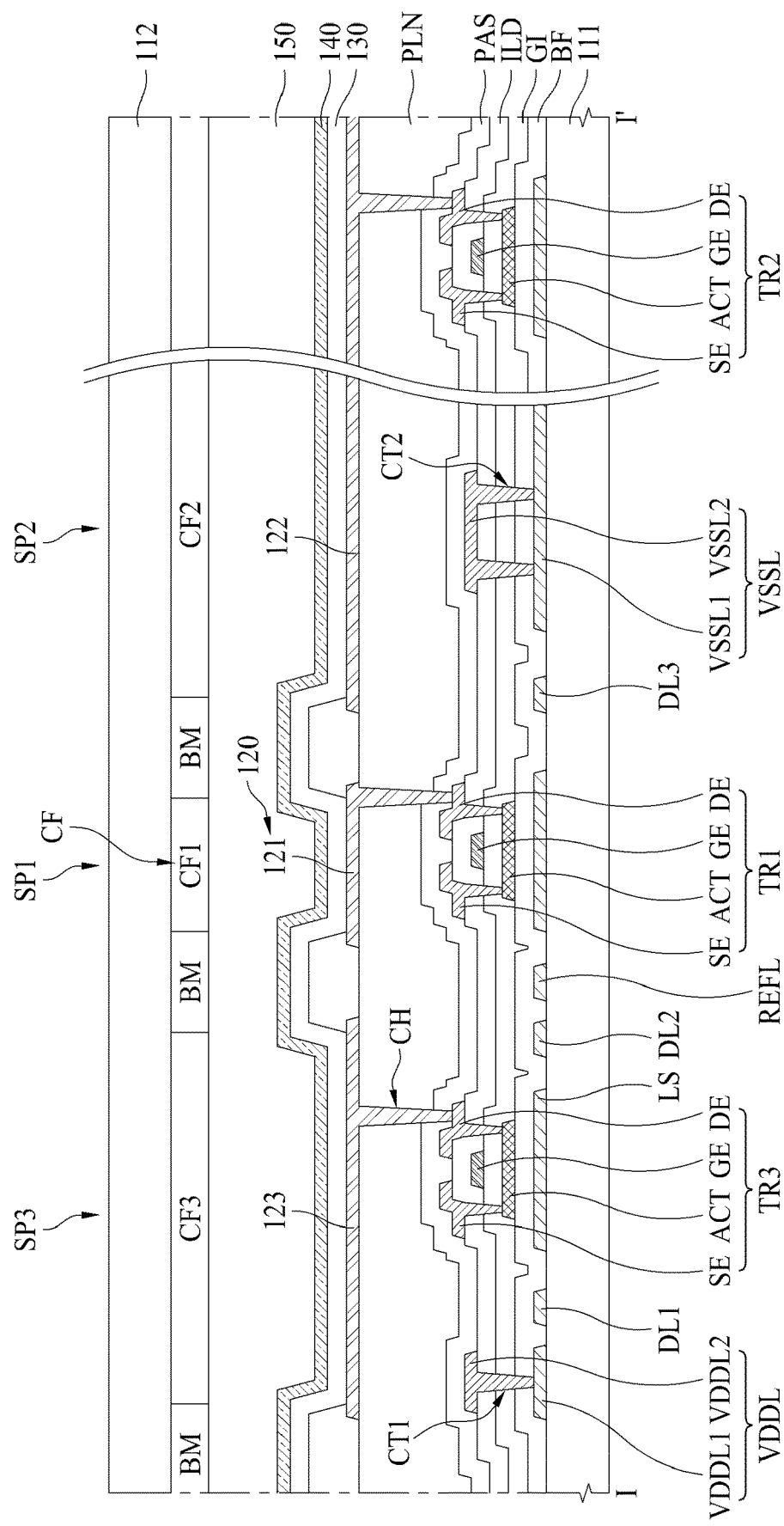
FIG. 5 is a cross-sectional view taken along line I-I' of FIG. 4.
Figure 6A:
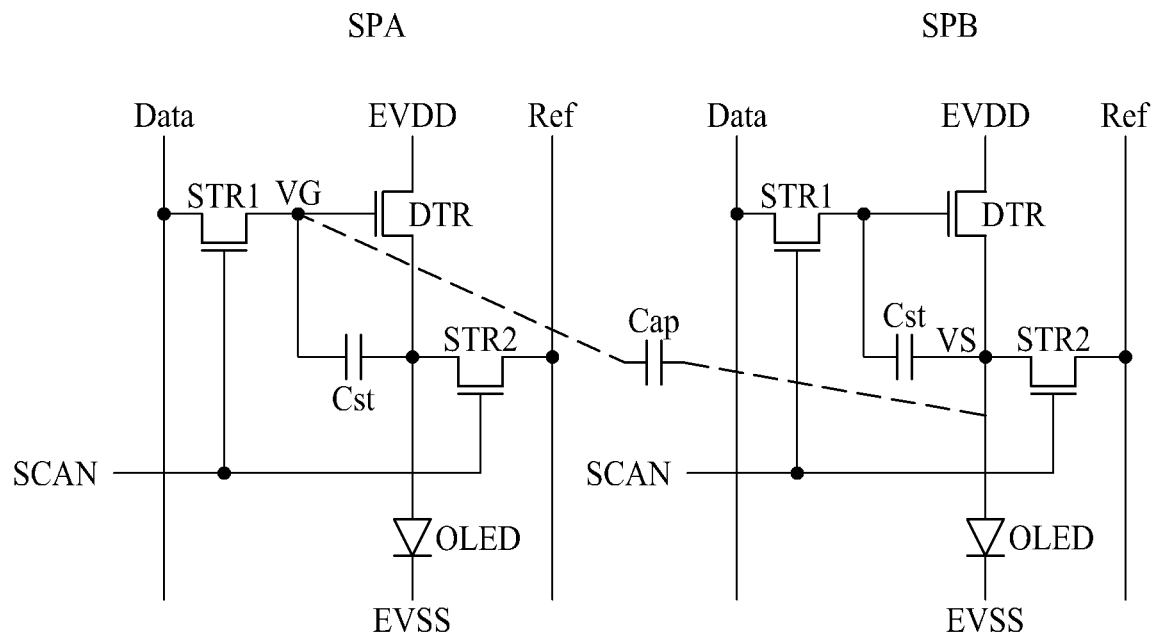
FIG. 6A is a view illustrating parasitic capacitance occurring between adjacent subpixels.
Figure 6B:
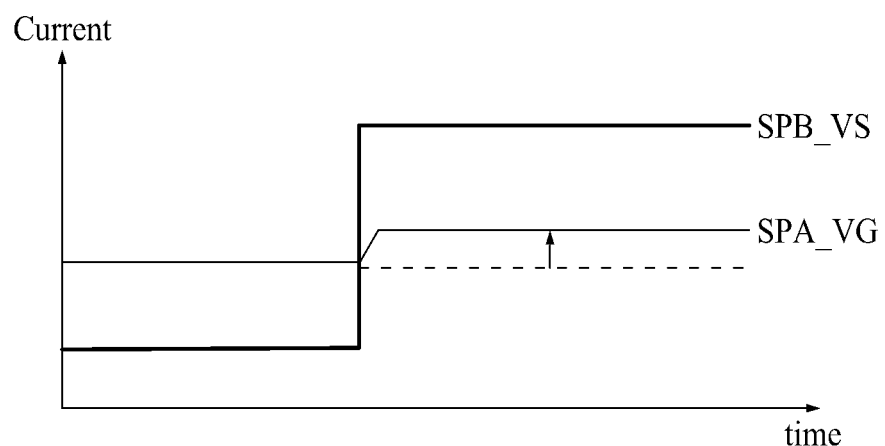
FIG. 6B is a view illustrating a current rise based on parasitic capacitance.

FIG. 2 is a schematic plane view illustrating a display pane according to one embodiment of the present disclosure, and FIG. 3 is an enlarged view illustrating an area A of FIG. 2. FIG. 4 is a view illustrating an example that a plurality of signal lines and a plurality of driving transistors are disposed in a pixel of FIG. 3, FIG. 5 is a cross-sectional view taken along line I-I' of FIG. 4, FIG. 6A is a view illustrating parasitic capacitance occurring between adjacent subpixels and FIG. 6B is a view illustrating a current rise based on parasitic capacitance.

In the following description, although the display panel 110 is embodied as a transparent display panel, the display panel 110 may be embodied as a general display panel in which a transmissive area TA is not provided.

Referring to FIG. 2 and FIG. 6, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the display panel 110, or the non-display area NDA of both peripheral sides of the display panel 110 by a gate driver in panel (GIP) method. For example, as shown in FIG. 2, the scan driver 205 may be provided in both side of the display area DA of the display panel 110, but these scan drivers are not limited thereto. The scan driver 205 may be provided on a single side of the display area DA of the display panel 110, while other sides are free of the scan driver 205.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than β %, for example, about 50%. At this time, α is greater than β. A user may view an object or background arranged over a rear surface of the display panel 110 due to the transmissive area TA.

The non-transmissive area NTA may include a plurality of pixels P, and a plurality of first and second signal lines SL1 and SL2 for supplying signals to the plurality of pixels P, respectively.

The plurality of first signal lines SL1 may be extended in a first direction (e.g., X-axis direction). The plurality of first signal lines SL1 may cross the plurality of second signal lines SL2. Each of the plurality of first signal lines SL1 may include at least one scan line SCANL.

Hereinafter, when the first signal line SL1 includes a plurality of lines, the first signal line SL1 may refer to a signal line group including a plurality of lines. For example, one first signal line SL1 may refer to a signal line group including two scan lines SCANL.

The plurality of second signal lines SL2 may be extended in a second direction (e.g., Y-axis direction). Each of the plurality of second signal lines SL2 may include at least one of the data lines DL1, DL2, DL3 and DL4, a pixel power line VDDL, a reference line REFL and a common power line VSSL.

Hereinafter, when the second signal line SL2 includes a plurality of lines, the second signal line SL2 may refer to a signal line group including a plurality of lines. For example, one second signal line SL2 may refer to a signal line group including four data lines DL1, DL2, DL3 and DL4, a pixel power line VDDL, a reference line REFL and a common power line VSSL.

A transmissive area TA may be disposed between the first signal lines SL1 adjacent to each other. In addition, the transmissive area TA may be disposed between the second signal lines SL2 adjacent to each other. As a result, the transmissive area TA may be surrounded by two first signal lines SL1 and two second signal lines SL2.

Pixels P may be provided to overlap at least one of the first signal line SL1 and the second signal line SL2, thereby emitting predetermined light or selected light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a red color. The second subpixel P2 may include a second emission area EA2 emitting light of a blue color. The third subpixel P3 may include a third emission area EA3 emitting light of a white color. The fourth subpixel P4 may include a fourth emission area EA4 emitting light of a green color. However, the emission areas are not limited to this example. Also, the arrangement order of the subpixels P1, P2, P3 and P4 may be changed in various ways.

Hereinafter, for convenience of description, the description will be given based on that a first subpixel P1 is a red subpixel emitting red light, a second subpixel P2 is a blue subpixel emitting blue light, a third subpixel P3 is a white subpixel emitting white light, and a fourth subpixel P4 is a green subpixel emitting green light.

Each of the plurality of pixels P may be provided in a non-transmissive area NTA disposed between the transmissive areas TA. The plurality of pixels P may be disposed to be adjacent to each other in the non-transmissive area NTA in a second direction (e.g., Y-axis direction). In detail, the plurality of pixels P may include a first pixel P1 provided in the non-transmissive area NTA and a second pixel P2 disposed to be adjacent to the first pixel P1 in the second direction. Each of the first pixel P1 and the second pixel P2 may include a first subpixel SP1, a second subpixel SP2 and a third subpixel SP3, and may further include a fourth subpixel SP4 in accordance with one embodiment.

The first pixel P1 and the second pixel P2 disposed to be adjacent to each other in the second direction may share at least two of the first subpixel SP1, the second subpixel SP2, the third subpixel SP3 and the fourth subpixel SP4. For example, the first pixel P1 and the second pixel P2 may share the first subpixel SP1 and the second subpixel SP2 as shown in FIG. 3. For convenience of description, the following description will be based on that the first pixel P1 and the second pixel P2 share the first subpixel SP1 and the second subpixel SP2.

Since the first subpixel SP1 and the second subpixel SP2 are shared by the first pixel P1 and the second pixel P2, which are disposed to be adjacent to each other in the second direction, the first subpixel SP1 and the second subpixel SP2 may be disposed to be adjacent to each other in the first direction, and may be formed longitudinally in the second direction.

In detail, the first subpixel SP1 may be formed from the first pixel P1 to the second pixel P2. The first subpixel SP1 may be disposed to be adjacent to the third subpixel SP3 of the first pixel P1, and furthermore, may be disposed to be adjacent to the third subpixel SP3 of the second pixel P2.

Therefore, a width W1 in the first direction of the first subpixel SP1 may be narrower than a width W3 in the first direction of the third subpixel SP3, but a width W5 in the second direction of the first subpixel SP1 may be wider than a width W7 in the second direction of the third subpixel SP3. The width W5 in the second direction of the first subpixel SP1 may be greater than a sum of the width W7 in the second direction of the third subpixel SP3 of the first pixel P1 and the width W7 in the second direction of the third subpixel SP3 of the second pixel P2. That is, the width W5 in the second direction of the first subpixel SP1 may be wider than the width W7 in the second direction of the third subpixel SP3 as much as twice or more.

Also, as shown in FIG. 3, in each of the first pixel P1 and the second pixel P2, the third subpixel SP3 and the fourth subpixel SP4 may be disposed in the second direction. In this case, the first subpixel SP1 may be disposed to be adjacent to the third subpixel SP3 and the fourth subpixel SP4 of the first pixel P1 and furthermore, may be disposed to be adjacent to the third subpixel SP3 and the fourth subpixel SP4 of the second pixel P2.

A width W4 in the first direction of the fourth subpixel SP4 may be the same as or similar to the width W3 in the first direction of the third subpixel SP3. Therefore, the width W1 in the first direction of the first subpixel SP1 may be narrower than the width W4 in the first direction of the fourth subpixel SP4. The width W5 in the second direction of the first subpixel SP1 may be wider than a width W8 in the second direction of the fourth subpixel SP4.

The width W5 in the second direction of the first subpixel SP1 may be greater than a sum of the width W7 in the second direction of the third subpixel SP3 of the first pixel P1, the width W8 in the second direction of the fourth subpixel SP4 of the first pixel P1, the width W7 in the second direction of the third subpixel SP3 of the second pixel P2 and the width W8 in the second direction of the fourth subpixel SP4 of the second pixel P2. That is, the width W5 in the second direction of the first subpixel SP1 may be greater than the sum of the width W7 in the second direction of the third subpixel SP3 and the width W8 in the second direction of the fourth subpixel SP4 as much as twice or more.

In addition, the second subpixel SP2 may be formed from the first pixel P1 to the second pixel P2. The second subpixel SP2 is disposed to be adjacent to the third subpixel SP3 of the first pixel P1, and furthermore, may be disposed to be adjacent to the third subpixel SP3 of the second pixel P2.

Therefore, the width W2 in the first direction of the second subpixel SP2 may be narrower than the width W3 in the first direction of the third subpixel SP3, but the width W6 in the second direction of the second subpixel SP2 may be wider than the width W7 in the second direction of the third subpixel SP3. The width W6 in the second direction of the second subpixel SP2 may be greater than the sum of the width W7 in the second direction of the third subpixel SP3 of the first pixel P1 and the width W7 in the second direction of the third subpixel SP3 of the second pixel P2. That is, the width W6 in the second direction of the second subpixel SP2 may be wider than the width W7 in the second direction of the third subpixel SP3 as much as twice or more.

In addition, when the third subpixel SP3 and the fourth subpixel SP4 are disposed in the second direction as shown in FIG. 3, the second subpixel SP2 of each of the first pixel P1 and the second pixel P2 may be disposed to be adjacent to the third subpixel SP3 and the fourth subpixel SP4 of the first pixel P1, and furthermore, may be disposed to be adjacent to the third subpixel SP3 and the fourth subpixel SP4 of the second pixel P2.

The width W2 in the first direction of the second subpixel SP2 is narrower than the width W4 in the first direction of the fourth subpixel SP4, but the width W6 in the second direction of the second subpixel SP2 may be wider than the width W8 in the second direction of the fourth subpixel SP4.

The width W6 in the second direction of the second subpixel SP2 may be greater than the sum of the width W7 in the second direction of the third subpixel SP3 of the first pixel P1, the width W8 in the second direction of the fourth subpixel SP4, the width W7 in the second direction of the third subpixel SP3 of the second pixel P2 and the width W8 in the second direction of the fourth subpixel SP4. That is, the width W5 in the second direction of the second subpixel SP2 may be greater than the sum of the width W7 in the second direction of the third subpixel SP3 and the width W8 in the second direction of the fourth subpixel SP4.

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor, and a driving transistor TR.

In the display panel 110, the plurality of signal lines as well as the first subpixel SP1, the second subpixel SP2, the third subpixel SP3 and the fourth subpixel SP4 should be disposed in the non-transmissive area NTA except the transmissive area TA. Therefore, the first subpixel SP1, the second subpixel SP2, the third subpixel SP3 and the fourth subpixel SP4 overlap at least one of the first signal line SL1 or the second signal line SL2.

The plurality of signal lines may include a first signal line SL1 extended in the first direction (e.g., X-axis direction) and a second signal line SL2 extended in the second direction (e.g., Y-axis direction) as described above.

The first signal line SL1 may include a scan line SCANL, but is not limited thereto. The scan line SCANL may supply a scan signal to the subpixels SP1, SP2, SP3 and SP4 provided in the display area DA.

The second signal line SL2 may include at least one of data lines DL1, DL2 and DL3, a pixel power line VDDL, a reference line REFL and a common power line VSSL, but is not limited thereto.

The reference line REFL may supply a reference voltage (or an initialization voltage or a sensing voltage) to the driving transistor TR of each of the subpixels SP1, SP2, SP3 and SP4 provided in the display area DA.

Each of the data lines DL1, DL2 and DL3 may supply a data voltage to at least one of the subpixels SP1, SP2, SP3 and SP4 provided in the display area DA. For example, the first data line DL1 may supply a first data voltage to a first driving transistor TR1 of the first subpixel SP1 and a second driving transistor TR2 of the second subpixel SP2, the second data line DL2 may supply a second data voltage to a third driving transistor TR3 of the third subpixel SP3, and the third data line DL3 may supply a third data voltage to a fourth driving transistor TR4 of the fourth subpixel SP4.

The pixel power line VDDL may supply a first power source to the anode electrode 120 of each of the subpixels SP1, SP2, SP3 and SP4. The common power line VSSL may supply a second power source to the cathode electrodes 140 of each of the subpixels SP1, SP2, SP3 and SP4.

When the second signal line SL2 includes the pixel power line VDDL and the common power line VSSL, since a higher voltage is applied to the pixel power line VDDL and the common power line VSSL than the other signal lines, it is preferable that the pixel power line VDDL and the common power line VSS have a wider area than the other signal lines. Each of the pixel power line VDDL and the common power line VSSL may be formed as a double layer to make sure of a wide area. For example, the pixel power line VDDL may include a first pixel power line VDDL-1 and a second pixel power line VDDL-2, as shown in FIG. 5. The first pixel power line VDDL-1 and the second pixel power line VDDL-2 may electrically be connected with each other through a plurality of first contact portions CT1. In addition, the common power line VSSL may include a first common power line VSSL-1 and a second common power line VSSL-2. The first common power line VSSL-1 and the second common power line VSSL-2 may electrically be connected with each other through a plurality of second contact portions CT2.

The switching transistor is switched in accordance with the scan signal supplied to the scan line SCANL to supply the data voltages supplied from the data lines DL1, DL2 and DL3 to the driving transistor TR.

The sensing transistor serves to sense a deviation in a threshold voltage of the driving transistor TR, which causes deterioration of image quality.

The driving transistor TR is switched in accordance with the data voltage supplied from the switching thin film transistor to generate a data current from a power source supplied from the pixel power line VDDL and supply the data current to the anode electrode 120 of the subpixel. The driving transistor TR is provided for each of the subpixels SP1, SP2, SP3 and SP4, and includes an active layer ACT, a gate electrode GE, a source electrode SE and a drain electrode DE. In detail, a first driving transistor TR1 may supply the data current to a first anode electrode 121 of the first subpixel SP1, and a second driving transistor TR2 may supply the data current to a second anode electrode 122 of the second subpixel SP2. A third driving transistor TR3 may supply the data current to a third anode electrode 123 of the third subpixel SP3, and a fourth driving transistor TR4 may supply the data current to a fourth anode electrode 124 of the fourth subpixel SP4.

The capacitor serves to maintain the data voltage supplied to the driving transistor TR for one frame. The capacitor may include a first capacitor electrode and a second capacitor electrode.

Referring to FIG. 5, an active layer ACT may be provided over a first substrate 111. The active layer ACT may be formed of a silicon-based semiconductor material or an oxide-based semiconductor material.

A light shielding layer LS for shielding external light incident on the active layer ACT may be provided between the active layer ACT and the first substrate 111. The light-shielding layer LS may be formed of a material having conductivity, and may be formed of a single layer or multi-layer made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light shielding layer LS and the active layer ACT.

A gate insulating layer GI may be provided over the active layer ACT. The gate insulating layer GI may be formed of an inorganic film, for example, a silicon oxide film (SiOX), a silicon nitride film (SiNx), or a multi-film of SiOx and SiNx.

In addition, at least one of the plurality of signal lines may be provided in the same layer as the light shielding layer LS. For example, the first pixel power line VDDL-1, the first data line DL1, the second data line DL2, the third data line DL3, the fourth data line DL4, the first common power line VSS-1 and the reference line REFL may be formed of the same material as that of the light shielding layer LS on the same layer as the light shielding layer LS, but are not limited thereto.

A gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic film, for example, a silicon oxide film (SiOX), a silicon nitride film (SiNx), or a multi-film of SiOx and SiNx.

The source electrode SE and the drain electrode DE may be provided over the interlayer dielectric layer ILD. The source electrode SE and the drain electrode DE may be connected to the active layer ACT through a contact hole that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

In addition, at least one of the plurality of signal lines may be provided in the same layer as the source electrode SE and the drain electrode DE. For example, the second pixel power line VDDL-2 and the second common power line VSSL-2 may be formed of the same material as that of the source electrode SE and the drain electrode DE in the same layer as the source electrode SE and the drain electrode DE, but is not limited thereto.

A passivation layer PAS for protecting the driving transistors TR1, TR2, TR3 and TR4 may be provided over the source electrode SE and the drain electrode DE. A planarization layer PLN for planarizing a step difference due to the driving transistors TR1, TR2, TR3 and TR4 may be provided over the passivation layer PAS. The planarization layer PLN may be formed of an organic layer such as an acrylic resin, an epoxy resin, a phenolic resin, a polyamide resin and a polyimide resin.

Light emitting elements comprised of an anode electrode 120, a light emitting layer 130 and a cathode electrode 140, and a bank 125 are provided over the planarization layer PLN.

The anode electrode 120 may be provided for each of the subpixels SP1, SP2, SP3 and SP4. In detail, one anode electrode 120 may be provided in the first subpixel SP1, another anode electrode 120 may be provided in the second subpixel SP2, still another anode electrode 120 may be provided in the third subpixel SP3, and further still another anode electrode 120 may be provided in the fourth subpixel SP4. The anode electrode 120 is not provided in the transmissive area TA.

The anode electrode 120 may be formed on the planarization layer PLN and connected with the driving transistor TR. In detail, the first anode electrode 121 may be provided to overlap at least a portion of the first driving transistor TR1 and connected to the source electrode SE or the drain electrode of the first driving transistor TR1 through a contact hole CH that passes through the planarization layer PLN and the passivation layer PAS. Therefore, the first anode electrode 121 may electrically be connected with the first driving transistor TR1.

The second anode electrode 122 may be provided to overlap at least a portion of the second driving transistor TR2 and connected to the source electrode SE or the drain electrode of the second driving transistor TR2 through the contact hole CH that passes through the planarization layer PLN and the passivation layer PAS. Therefore, the second anode electrode 122 may electrically be connected with the second driving transistor TR2.

The third anode electrode 123 may be provided to overlap at least a portion of the third driving transistor TR3 and connected to the source electrode SE or the drain electrode of the third driving transistor TR3 through the contact hole CH that passes through the planarization layer PLN and the passivation layer PAS. Therefore, the third anode electrode 123 may electrically be connected with the third driving transistor TR3.

The fourth anode electrode 124 may be provided to overlap at least a portion of the fourth driving transistor TR4 and connected to the source electrode SE or the drain electrode of the fourth driving transistor TR4 through the contact hole CH that passes through the planarization layer PLN and the passivation layer PAS. Therefore, the fourth anode electrode 124 may electrically be connected with the fourth driving transistor TR4.

The display panel 110 according to one embodiment of the present disclosure is characterized in that the first pixel P1 and the second pixel P2, which are disposed to be adjacent to each other, share at least two subpixels, for example, the first subpixel SP1 and the second subpixel SP2. In this case, one first subpixel SP1 and one second subpixel SP2 may be disposed to be adjacent to each other in the first direction and longitudinally formed in the second direction.

The first subpixel SP1 and the second subpixel SP2, which are longitudinally disposed in the second direction, may include a portion of the plurality of signal lines DL1, DL2, DL3, REFL, VSSL, VDDL and SACNL, and the driving transistors TR1 and TR2. At this time, since the first subpixel SP1 and the second subpixel SP2 may have narrow widths W1 and W2 in the first direction, there is a spatial limitation in arrangement of a portion of the signal lines DL1, DL2, DL3, REFL, VSSL and VDDL included in the second signal line SL2 and the driving transistors TR1 and TR2.

On the other hand, since the third subpixel SP3 and the fourth subpixel SP4 have widths W3 and W4 in the first direction, which are wider than those of the first subpixel SP1 and the second subpixel SP2, the third subpixel SP3 and the fourth subpixel SP4 may have a relatively spatial margin in disposing a portion of the signal lines DL1, DL2, DL3, REFL, VSSL and VDDL included in the second signal line SL2 and the driving transistors TR3 and TR4.

The third driving transistor TR3 may be disposed in the third subpixel SP3, and the fourth driving transistor TR4 may be disposed in the fourth subpixel SP4. A portion of the signal lines DL1, DL2, DL3, REFL, VSSL and VDDL included in the second signal line SL2, for example, the pixel power line VDDL, the second data line DL2, the third data line DL3 and the reference line REFL may be provided to partially overlap the third subpixel SP3 and the fourth subpixel SP4, as shown in FIG. 4.

Although there is a spatial margin in the third subpixel SP3 and the fourth subpixel SP4, it may be difficult to dispose all of the signal lines DL1, DL2, DL3, REFL, VSSL and VDDL included in the second signal line SL2 extended in the second direction. Therefore, one or two of the signal lines DL1, DL2, DL3, REFL, VSSL and VDDL included in the second signal line SL2 may partially overlap the first subpixel SP1 and the second subpixel SP2 rather than the third subpixel SP3 and the fourth subpixel SP4.

For example, as shown in FIG. 4, the common power line VSSL and the first data line DL1 may overlap with the first subpixel SP1 and the second subpixel SP2, but are not necessarily limited thereto. In another embodiment, the common power line VSSL and the first data line DL1 may be provided to partially overlap the first subpixel SP1 and the second subpixel SP2. In still another embodiment, only the first data line DL1 may be provided to partially overlap the first subpixel SP1 and the second subpixel SP2.

Hereinafter, for convenience of description, it is assumed that the common power line VSSL and the first data line DL1 partially overlap the first subpixel SP1 and the second subpixel SP2.

The common power line VSSL and the first data line DL1 may be extended from the display area DA in a straight line in the second direction (e.g., Y-axis direction). In this case, the common power line VSSL and the first data line DL1 may overlap any one of the first subpixel SP1 and the second subpixel SP2. For example, the common power line VSSL and the first data line DL1 may overlap only the second subpixel SP2.

Meanwhile, a space in which the first or second driving transistor TR1 or TR2 is to be disposed is not sufficient in the first subpixel SP1 or the second subpixel SP2, which partially overlaps the common power line VSSL and the first data line DL1. Therefore, the first and second driving transistors TR1 and TR2 are all disposed in the first subpixel SP1 or the second subpixel SP2, which does not overlap the common power line VSSL and the first data line DL1.

For example, when the common power line VSSL and the first data line DL1 partially overlap the second subpixel SP2, the first and second driving transistors TR1 and TR2 may be disposed in the first subpixel SP1. In this case, the second driving transistor TR2 connected with the second anode electrode 122 of the second subpixel SP2 as well as the first driving transistor TR1 connected with the first anode electrode 121 may be disposed below the first anode electrode 121 of the first subpixel SP1.

As described above, when the first anode electrode 121 of the first subpixel SP1 and the second driving transistor TR2 of the second subpixel SP2 overlap each other, parasitic capacitance may occur between the first anode electrode 121 and the second driving transistor TR2. In more detailed description referring to FIG. 6, A-subpixel SPA and B-subpixel SPB may include a first switching transistor STR1, a second switching transistor STR2, a driving transistor DTR, a capacitor Cst, and an organic light emitting diode OLED.

The first switching transistor STR1 may be switched in accordance with a scan signal Scan supplied to the scan line SCANL to supply a data voltage Data, which is supplied to the data line DL, to a gate node VG of the driving transistor DTR.

The driving transistor DTR is switched in accordance with the data voltage Data supplied from the first switching transistor STR1 to control a data current Ioled flowing to the OLED by the driving voltage EVDD.

The capacitor Cst may be connected between the gate node VG of the driving transistor DTR and a source node VS to store a voltage corresponding to the data voltage Data supplied to the gate node VG of the driving transistor DTR and turn on the driving transistor DTR with the stored voltage.

The second switching transistor STR2 may be switched in accordance with the scan signal Scan supplied to the scan line SCANL to transmit a reference voltage Ref supplied from the reference line REFL to the source node VS of the driving transistor DTR.

The anode electrode 120 of the organic light emitting diode OLED may be connected to the source node VS of the driving transistor DTR and the cathode electrode 140 thereof may be connected to the common power line VSSL to which a cathode voltage EVSS is applied, thereby emitting light by the data current supplied from the driving transistor DTR.

When the gate node VG of the driving transistor DTR of the A-subpixel SPA having the above structure partially overlaps the anode electrode 120 of the B-subpixel SPB, parasitic capacitance cap may occur between the gate node VG of the A-subpixel SPA and the anode electrode 120 of the B-subpixel SPB.

When the data current of the source node VS of the B-subpixel SPB is increased, the voltage (current) of the gate node VG of the driving transistor DTR of the A-subpixel SPA provided below the anode electrode 120 of the B-subpixel SPB is also increased. Therefore, the luminance of the A-subpixel SPA may be increased.

As a result, when the anode electrode 120 of the A-subpixel SPA partially overlaps the gate node VG of the driving transistor DTR of the B-subpixel SPB, parasitic capacitance cap occurs, whereby a problem may occur in that luminance of the B-subpixel SPB is changed.

In the display panel 110 according to one embodiment of the present disclosure, the first and second driving transistors TR1 and TR2 are not disposed only in one subpixel to prevent luminance of adjacent subpixels, for example, the first subpixel SP1 and the second subpixel SP2 from being changed by capacitive coupling.

In detail, the first subpixel SP1 may include a first transistor area TRA1 provided with the first driving transistor TR1, and a first signal line area SLA1 provided with a portion of the signal lines DL1, DL2, DL3, REFL, VSSL and VDDL included in the second signal line SL2, for example, the common power line VSSL and the first data line DL1.

That is, in the display panel 110 according to one embodiment of the present disclosure, the first driving transistor TR1 may partially overlap the first anode electrode 121 of the first subpixel SP1. In particular, at least a portion of the first anode electrode 121 of the first subpixel SP1 may overlap the gate electrode GE of the first driving transistor TR1.

The second subpixel SP2 may include a second transistor area TR2 provided with the second driving transistor TR2 and a second signal line area SLA2 provided with a portion of the signal lines DL1, DL2, DL3, REFL, VSSL and VDDL included in the second signal line SL2, for example, the common power line VSSL and the first data line DL1. That is, in the display panel 110 according to one embodiment of the present disclosure, the second driving transistor TR2 may overlap at least a portion of the second anode electrode 122 of the second subpixel SP2. In particular, the second anode electrode 122 of the second subpixel SP2 may partially overlap the gate electrode GE of the second driving transistor TR2.

In the first transistor area TRA1 of the first subpixel SP1, the first signal line area SLA1 of the first subpixel SP1 may be disposed in the second direction, and the second signal line area SLA2 of the second subpixel SP2 may be disposed in the first direction. In addition, in the first signal line area SLA1 of the first subpixel SP1, the second signal line area SLA2 of the second subpixel SP2 may be disposed in the first direction.

As a result, the first driving transistor TR1 may be provided to overlap at least a portion of the first subpixel SP1, and the second driving transistor TR2 may be provided to overlap at least a portion of the second subpixel SP2. A portion of the signal lines DL1, DL2, DL3, REFL, VSSL and VDDL included in the second signal line SL2, for example, the common power line VSSL and the first data line DL1 may be provided to alternately pass through the first subpixel SP1 and the second subpixel SP2.

Therefore, in the display panel 110 according to one embodiment of the present disclosure, luminance of adjacent subpixels, for example, the first subpixel SP1 and the second subpixel SP2 may be prevented from being changed by capacitive coupling.

The anode electrode 120 described as above may be formed of a metal material having high reflectance, such as a deposited structure (Ti/Al/Ti) of Al and Ti, a deposited structure (ITO/Al/ITO) of Al and ITO, Ag alloy, a deposited structure (ITO/Ag alloy/ITO) of Ag alloy and ITO, MoTi alloy, and a deposited structure (ITO/MoTi alloy/ITO) of MoTi alloy and ITO. The Ag alloy may be an alloy of Ag, Pd, Cu, and the like. The MoTi alloy may be an alloy of Mo and Ti.

The bank 125 may be provided over the planarization layer PLN. In addition, the bank 125 may be provided between the anode electrodes 120. The bank 125 may be provided to cover or at least partially cover the edges of each of the anode electrodes 120 and expose a portion of each of the anode electrodes 120. Therefore, the bank 125 may prevent light emission efficiency from being deteriorated due to a current concentrated on each end of each of the anode electrodes 120.

The bank 125 may border the light emission areas EA1, EA2, EA3 and EA4 of the subpixels SP1, SP2, SP3 and SP4. The emission areas EA1, EA2, E3 and E4 of the subpixels SP1, SP2, SP3 and SP4 indicate areas where the anode electrode 120, the organic light emitting layer 130 and the cathode electrode 140 are sequentially deposited so that holes from the anode electrode 120 and electrons from the cathode electrode 140 are combined with each other in the organic light emitting layer 130 to emit light. In this case, the area where the bank 125 is provided does not emit light and thus may be a non-emission area, and the area where the bank 125 is not provided is not provided and the anode electrode 120 is exposed may be the light emission areas EA1, EA2, EA3 and EA4.

The bank 125 may be formed of an organic film such as an acrylic resin, an epoxy resin, a phenolic resin, a polyamide resin and a polyimide resin.

The organic light emitting layer 130 may be provided over the anode electrode 120. The organic light emitting layer 130 may include a hole transporting layer, a light emitting layer and an electron transporting layer. In this case, when a voltage is applied to the anode electrode 120 and the cathode electrode 140, holes and electrons move to the light emitting layer through the hole transport layer and the electron transport layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, in the organic light emitting layer 130, a light emitting layer may be provided for each of the subpixels SP1, SP2, SP3 and SP4. For example, a red light emitting layer for emitting red light may be provided in the first subpixel SP1, a white light emitting layer for emitting white light may be provided in the second subpixel SP2, a blue light emitting layer for emitting blue light may be provided in the third subpixel SP3, and a green light emitting layer for emitting green light may be provided in the fourth subpixel SP4. In this case, the light emitting layer of the organic light emitting layer 130 is not provided in the transmissive area TA.

The cathode electrode 140 may be provided over the organic light emitting layer 130 and the bank 125. The cathode electrode 140 may also be provided in the transmissive area TA as well as the non-transmissive area NTA that includes a light emission area EA, but is not limited thereto. The cathode electrode 140 may be provided in the non-transmissive area NTA that includes the light emission areas EA1, EA2, EA3 and EA4, and may not be provided in the transmissive area TA to improve transmittance.

The cathode electrode 140 may be a common layer that is commonly provided in the subpixels SP1, SP2, SP3 and SP4 to apply the same voltage. The cathode electrode 140 may be formed of a conductive material capable of transmitting light. For example, the cathode electrode 140 may be formed of a low resistance metal material such as silver (Ag) or an alloy of magnesium (Mg) and silver (Ag).

An encapsulation layer 150 may be provided over the light emitting elements. The encapsulation layer 150 may be provided over the cathode electrode 140 to overlay the cathode electrode 140. The encapsulation layer 150 serves to prevent oxygen or moisture from being permeated into the organic light emitting layer 130 and the cathode electrode 140. To this end, the encapsulation layer 150 may include at least one inorganic film and at least one organic film.

Although not shown in FIG. 5, a capping layer may further be provided between the cathode electrode 140 and the encapsulation layer 150.

A color filter CF may be provided over the encapsulation layer 150. The color filter CF may be provided over one surface of the second substrate 112 facing the first substrate 111. In this case, the first substrate 111 provided with the encapsulation layer 150 and the second substrate 112 provided with the color filter CF may be bonded to each other by a separate adhesive layer 160. The adhesive layer 160 may be an optically clear resin layer (OCR) or an optically clear adhesive film (OCA).

The color filter CF may be provided to be patterned for each of the subpixels SP1, SP2, SP3 and SP4. In detail, the color filter CF may include a first color filter CF1, a second color filter CF2, a third color filter (not shown) and a fourth color filter (not shown). The first color filter CF1 may be disposed to correspond to the light emission area EA1 of the first subpixel SP1, and may be a red color filter that transmits red light. The second color filter CF2 may be disposed to correspond to the light emission area EA2 of the second subpixel SP2, and may be a blue color filter that transmits blue light. The third color filter (not shown) may be disposed to correspond to the light emission area EA3 of the third subpixel SP3, and may be a white color filter that transmits white light. The white color filter may be formed of a transparent organic material that transmits white light. The fourth color filter may be disposed to correspond to the light emission area EA4 of the fourth subpixel SP4, and may be a green color filter that transmits green light.

A black matrix BM may be provided between the color filters CF and between the color filter CF and the transmissive area TA. The black matrix BM may be disposed between the subpixels SP1, SP2, SP3 and SP4 to prevent color mixture between adjacent subpixels SP1, SP2, SP3 and SP4 from occurring. In addition, the black matrix BM may be disposed between the transmissive area TA and the plurality of subpixels SP1, SP2, SP3 and SP4 to prevent light emitted from each of the plurality of subpixels SP1, SP2, SP3 and SP4 from moving to the transmissive area TA.

The black matrix BM may include a material that absorbs light, for example, a black dye that absorbs all of the light in the visible wavelength range.

In the display panel 110 according to one embodiment of the present disclosure, the first pixel P1 and the second pixel P2 may share at least two subpixels. For example, when each of the first pixel P1 and the second pixel P2 includes four subpixels and there is no subpixel shared by the first pixel P1 and the second pixel P2, 8 subpixels per two pixels may be a beneficial configuration. When each of the first pixel P1 and the second pixel P2 includes four subpixels and two subpixels are shared by the first pixel P1 and the second pixel P2, six subpixels per two pixels may be a beneficial configuration. Therefore, the display panel 110 according to one embodiment of the present disclosure may increase the size of the transmissive area TA, thereby improving transparency.

Meanwhile, in the display panel 110 according to one embodiment of the present disclosure, two subpixels shared by the first pixel P1 and the second pixel P2, for example, the first subpixel SP1 and the second subpixel SP2 may longitudinally be formed from the first pixel P1 to the second pixel P2. That is, the first subpixel SP1 and the second subpixel SP2 may be formed in both the first pixel P1 and the second pixel P2.

Unlike one embodiment of the present disclosure, the first subpixel SP1 may be disposed in the first pixel P1 and the second subpixel SP2 may be disposed in the second pixel P2. However, in this case, the first subpixel SP1 and the second subpixel SP2 may be seen as a mosaic pattern, whereby image quality may be degraded.

In the display panel 110 according to one embodiment of the present disclosure, two subpixels shared by the first pixel P1 and the second pixel P2 may longitudinally be formed from the first pixel P1 to the second pixel P2 to prevent a mosaic pattern from being generated, whereby image quality may be improved.

Also, in the display panel 110 according to one embodiment of the present disclosure, the first driving transistor TR1 may be provided to overlap at least a portion of the first subpixel SP1, and the second driving transistor TR2 may be provided to overlap at least a portion of the second subpixel SP2. A portion of the signal lines DL1, DL2, DL3, REFL, VSSL and VDDL included in the second signal line SL2 may be provided to alternately pass through the first subpixel SP1 and the second subpixel SP2.

Therefore, the display panel 110 according to one embodiment of the present disclosure may prevent luminance of adjacent subpixels, for example, the first subpixel SP1 and the second subpixel SP2 from being changed by capacitive coupling.

Figure 7:
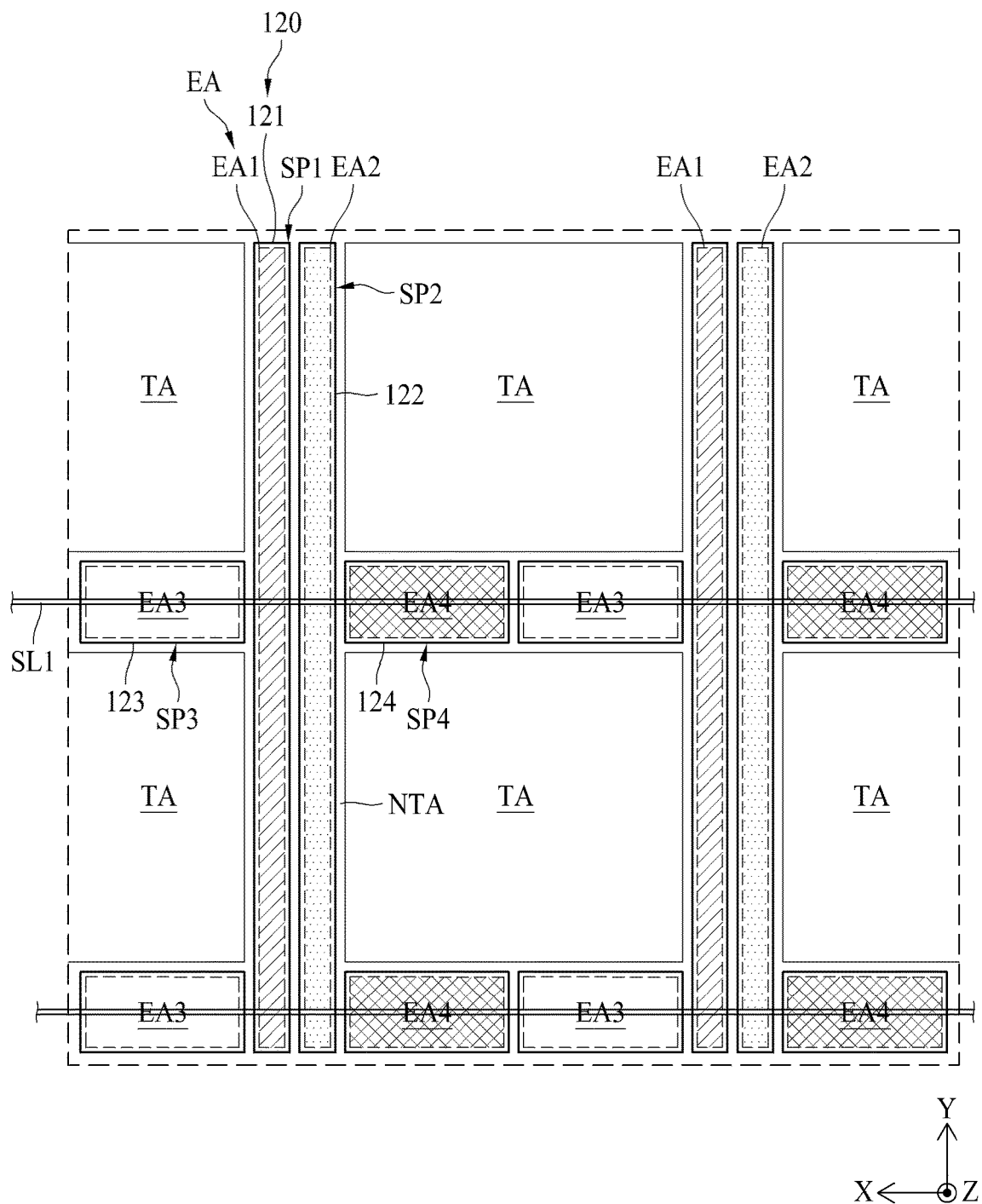
FIG. 7 is an enlarged view illustrating another example of an area A in FIG. 2.
Figure 8:
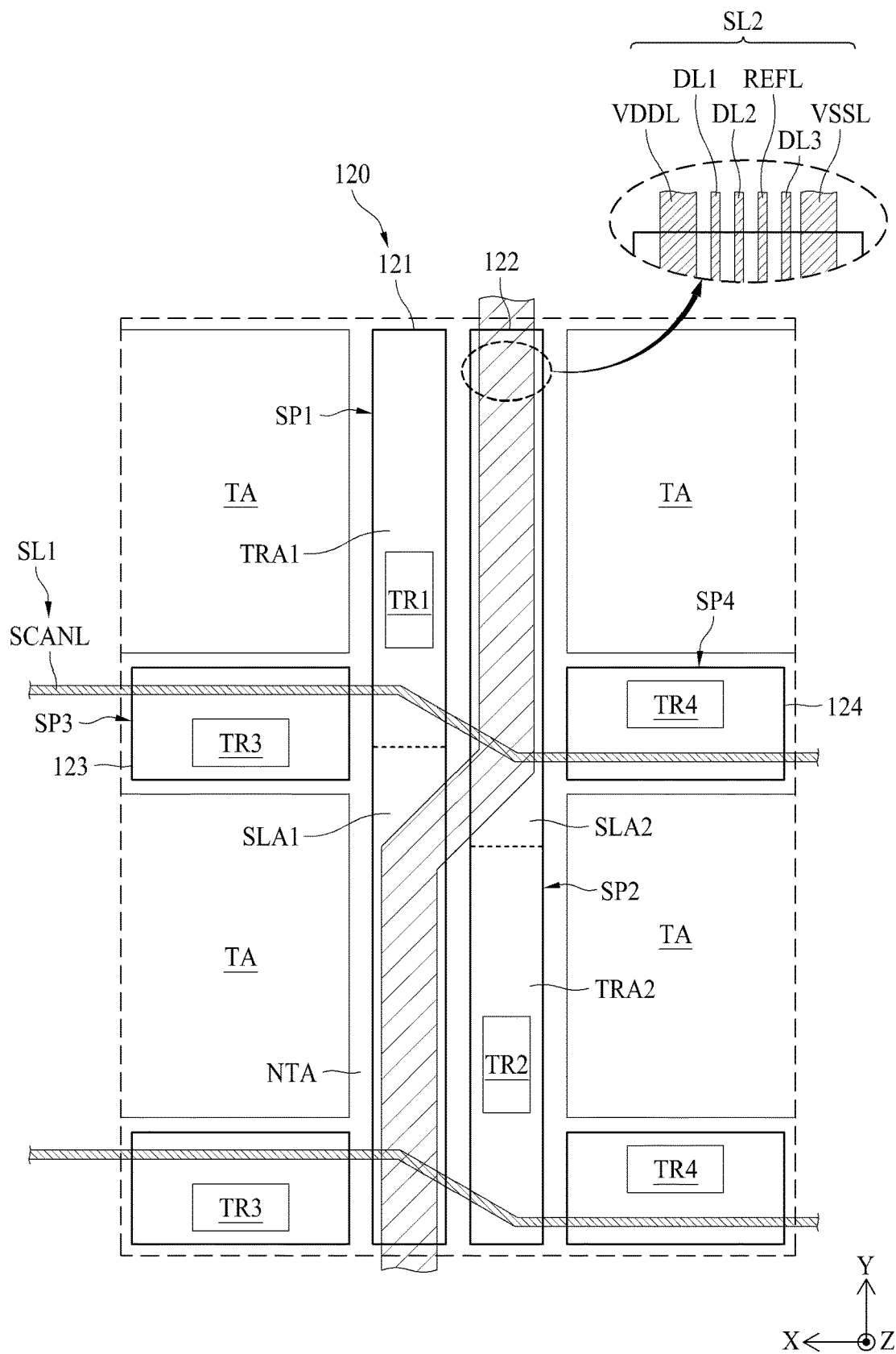
FIG. 8 is a view illustrating an example that a plurality of signal lines and a plurality of driving transistors are disposed in a pixel of FIG. 7.

FIG. 7 is an enlarged view illustrating another example of an area A in FIG. 2, and FIG. 8 is a view illustrating an example that a plurality of signal lines and a plurality of driving transistors are disposed in a pixel of FIG. 7.

The display panel 110 shown in FIGS. 7 and 8 is different from the display panel 110 shown in FIGS. 2 to 6 in positions of the subpixels SP1, SP2, SP3 and SP4, particularly the third subpixel SP3 and the fourth subpixel SP4.

Hereinafter, the description duplicated with the display panel 110 shown in FIGS. 2 to 6 will be omitted, and the following description will be based on the difference from the display panel 110 shown in FIGS. 2 to 6.

Referring to FIGS. 7 and 8, each of the plurality of pixels P may be provided in a non-transmissive area NTA disposed between transmissive areas TA. The plurality of pixels P may be disposed to be adjacent to each other in the non-transmissive area NTA in the second direction (e.g., Y-axis direction). In detail, the plurality of pixels P may include a first pixel P1 provided in the non-transmissive area NTA and a second pixel P2 disposed to be adjacent to the first pixel P1 in the second direction. Each of the first pixel P1 and the second pixel P2 may include a first subpixel SP1, a second subpixel SP2 and a third subpixel SP3, and may further include a fourth subpixel SP3 in accordance with one embodiment.

The first pixel P1 and the second pixel P2, which are disposed to be adjacent to each other in the second direction, may share at least two of the first subpixel SP1, the second subpixel SP2, the third subpixel SP3 and the fourth subpixel SP4. For example, the first pixel P1 and the second pixel P2 may share the first subpixel SP1 and the second subpixel SP2 as shown in FIG. 3. Hereinafter, for convenience of description, the first pixel P1 and the second pixel P2 share the first subpixel SP1 and the second subpixel SP2.

Since the first subpixel SP1 and the second subpixel SP2 are shared by the first pixel P1 and the second pixel P2, which are disposed to be adjacent to each other in the second direction, the first subpixel SP1 and the second subpixel SP2 may be disposed to be adjacent to each other in the first direction and longitudinally formed in the second direction.

As shown in FIG. 7, the third subpixel SP3 and the fourth subpixel SP4 in each of the first pixel P1 and the second pixel P2 may be disposed in the first direction with the first subpixel SP1 and the second subpixel SP2, which are interposed therebetween. In this case, the third subpixel SP3 may be disposed on one side of one of the first subpixel SP1 and the second subpixel SP2, and the fourth subpixel SP4 may be disposed on one side of the other one of the first subpixel SP1 and the second subpixel SP2. Hereinafter, for convenience of description, the third subpixel SP3 is disposed on one side of the first subpixel SP1, and the fourth subpixel SP4 is disposed on one side of the second subpixel SP2.

The first subpixel SP1 may be formed from the first pixel P1 to the second pixel P2. The first subpixel SP1 may be disposed to be adjacent to the third subpixel SP3 of the first pixel P1 and, furthermore, may be disposed to be adjacent to the third subpixel SP3 of the second pixel P2. At this time, the third subpixel SP3 of the first pixel P1 and the third subpixel SP3 of the second pixel P2 may be disposed on one side of the first subpixel SP1 with the transmissive area TA interposed therebetween.

Therefore, a width W1 in the first direction of the first subpixel SP1 may be narrower than a width W3 in the first direction of the third subpixel SP3, but a width W5 in the second direction of the first subpixel SP1 may be wider than a width W7 in the second direction of the third subpixel SP3. The width W5 in the second direction of the first subpixel SP1 may be greater than a sum of the width W7 in the second direction of the third subpixel SP3 of the first pixel P1 and the width W7 in the second direction of the third subpixel SP3 of the second pixel P2. That is, the width W5 in the second direction of the first subpixel SP1 may be wider than the width W7 in the second direction of the third subpixel SP3 as much as twice or more.

Also, the width W5 in the second direction of the first subpixel SP1 may be greater than a sum of the width W7 in the second direction of the third subpixel SP3 of the first pixel P1 and a width W9 in the second direction of the transmissive area TA. The width W5 in the second direction of the first subpixel SP1 may be greater than the sum of the width W7 in the second direction of the third subpixel SP3 and the width W9 in the second direction of the transmissive area TA as much as twice or more.

Meanwhile, the second subpixel SP2 may be formed from the first pixel P1 to the second pixel P2. The second subpixel SP2 is disposed to be adjacent to the fourth subpixel SP4 of the first pixel P1, and furthermore, may be disposed to be adjacent to the fourth subpixel SP4 of the second pixel P2. At this time, the fourth subpixel SP4 of the first pixel P1 and the fourth subpixel SP4 of the second pixel P2 may be disposed on one side of the second subpixel SP2 with the transmissive area TA interposed therebetween.

Therefore, the width W2 in the first direction of the second subpixel SP2 may be narrower than the width W4 in the first direction of the fourth subpixel SP4, but the width W6 in the second direction of the second subpixel SP2 may be wider than the width W8 in the second direction of the fourth subpixel SP4. The width W6 in the second direction of the second subpixel SP2 may be greater than the sum of the width W8 in the second direction of the fourth subpixel SP4 of the first pixel P1 and the width W8 in the second direction of the fourth subpixel SP4 of the second pixel P2. That is, the width W6 in the second direction of the second subpixel SP2 may be wider than the width W8 in the second direction of the fourth subpixel SP4 as much as twice or more.

The width W6 in the second direction of the second subpixel SP2 may be greater than the sum of the width W8 in the second direction of the fourth subpixel SP4 and the width W9 in the second direction of the transmissive area TA. The width W6 in the second direction of the second subpixel SP2 may be wider than the sum of the width W8 in the second direction of the fourth subpixel SP4 and the width W9 in the second direction of the transmissive area TA as much as twice or more.

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor, and a driving transistor TR.

In the display panel 110, the plurality of signal lines as well as the first subpixel SP1, the second subpixel SP2, the third subpixel SP3 and the fourth subpixel SP4 should be disposed in the non-transmissive area NTA except the transmissive area TA. Therefore, the first subpixel SP1, the second subpixel SP2, the third subpixel SP3 and the fourth subpixel SP4 overlap at least one of the first signal line SL1 or the second signal line SL2.

The plurality of signal lines may include a first signal line SL1 extended in the first direction (e.g., X-axis direction) and a second signal line SL2 extended in the second direction (e.g., Y-axis direction) as described above. The first signal line SL1 may include, but is not limited to, a scan line SCANL. The second signal line SL2 may include at least one of data lines DL1, DL2 and DL3, a pixel power line VDDL, a reference line REFL and a common power line VSSL, but is not limited thereto.

The first signal line SL1 may be extended in the first direction to overlap the first to fourth subpixels SP1, SP2, SP3 and SP4. On the other hand, the second signal line SL2 may partially overlap the first subpixel SP1 and the second subpixel SP2, which are longitudinally disposed in the second direction.

The plurality of signal lines DL1, DL2, DL3, REFL, VSSL and VDDL and the driving transistors TR1 and TR2 may be provided in the first subpixel SP1 and the second subpixel SP2 longitudinally disposed in the second direction. At this time, since the first subpixel SP1 and the second subpixel SP2 may have narrow widths W1 and W2 in the first direction, there is a spatial limitation in arrangement of the signal lines DL1, DL2, DL3, REFL, VSSL and VDDL included in the second signal line SL2 and the driving transistors TR1 and TR2.

At this time, the signal lines DL1, DL2, DL3, REFL, VSSL and VDDL included in the second signal line SL2 may be extended from the display area DA in a straight line in the second direction (e.g., Y-axis direction). In this case, the signal lines DL1, DL2, DL3, REFL, VSSL and VDDL included in the second signal line SL2 may overlap any one of the first subpixel SP1 and the second subpixel SP2. For example, the signal lines DL1, DL2, DL3, REFL, VSSL and VDDL included in the second signal line SL2 may overlap only the second subpixel SP2.

Meanwhile, a space in which the first and second driving transistors TR1 and TR2 are to be disposed is not sufficient in the first subpixel SP1 or the second subpixel SP2, which overlaps the second signal line SL2. Therefore, the first and second driving transistors TR1 and TR2 are all disposed in the first subpixel SP1 or the second subpixel SP2, which does not overlap the second signal line SL2.

For example, when the second signal line SL2 partially overlaps the second subpixel SP2, the first and second driving transistors TR1 and TR2 may be disposed in the first subpixel SP1. In this case, the second driving transistor TR2 connected with the second anode electrode 122 of the second subpixel SP2 as well as the first driving transistor TR1 connected with the first anode electrode 121 may be disposed below the first anode electrode 121 of the first subpixel SP1.

As described above, when the first anode electrode 121 of the first subpixel SP1 and the second driving transistor TR2 of the second subpixel SP2 overlap each other, parasitic capacitance may occur between the first anode electrode 121 and the second driving transistor TR2. For this reason, a problem may occur in that luminance of the second subpixel SP2 is changed.

In the display panel 110 according to one embodiment of the present disclosure, the first and second driving transistors TR1 and TR2 are not disposed only in one subpixel to prevent luminance of adjacent subpixels, for example, the first subpixel SP1 and the second subpixel SP2 from being changed by capacitive coupling.

In detail, the first subpixel SP1 may include a first transistor area TRA1 provided with the first driving transistor TR1, and a first signal line area SLA1 provided with the signal lines DL1, DL2, DL3, REFL, VSSL and VDDL included in the second signal line SL2. That is, in the display panel 110 according to one embodiment of the present disclosure, the first driving transistor TR1 may overlap at least a portion of the first anode electrode 121 of the first subpixel SP1. In particular, the first anode electrode 121 of the first subpixel SP1 may partially overlap the gate electrode GE of the first driving transistor TR1.

The second subpixel SP2 may include a second transistor area TR2 provided with the second driving transistor TR2 and a second signal line area SLA2 provided with the signal lines DL1, DL2, DL3, REFL, VSSL and VDDL included in the second signal line SL2. That is, in the display panel 110 according to one embodiment of the present disclosure, the second driving transistor TR2 may overlap at least a portion of the second anode electrode 122 of the second subpixel SP2. In particular, the second anode electrode 122 of the second subpixel SP2 may partially overlap the gate electrode GE of the second driving transistor TR2.

In the first transistor area TRA1 of the first subpixel SP1, the first signal line area SLA1 of the first subpixel SP1 may be disposed in the second direction, and the second signal line area SLA2 of the second subpixel SP2 may be disposed in the first direction. In addition, in the first signal line area SLA1 of the first subpixel SP1, the second signal line area SLA2 of the second subpixel SP2 may be disposed in the first direction.

As a result, the first driving transistor TR1 may be provided to overlap at least a portion of the first subpixel SP1, and the second driving transistor TR2 may be provided to overlap at least a portion of the second subpixel SP2. The signal lines DL1, DL2, DL3, REFL, VSSL and VDDL included in the second signal line SL2 may be provided to alternately pass through the first subpixel SP1 and the second subpixel SP2.

Therefore, in the display panel 110 according to one embodiment of the present disclosure, luminance of adjacent subpixels, for example, the first subpixel SP1 and the second subpixel SP2 may be prevented from being changed by capacitive coupling.

In FIG. 2 to FIG. 8, the first pixel P1 and the second pixel P2 in the display device 100 share at least two subpixels, for example, the first subpixel SP1 and the second subpixel SP2. However, a pixel structure according to the present disclosure is not limited to the display device 100 provided with a transmissive area TA, and may be applied to a general display device having no transmissive area TA.

Figure 9:
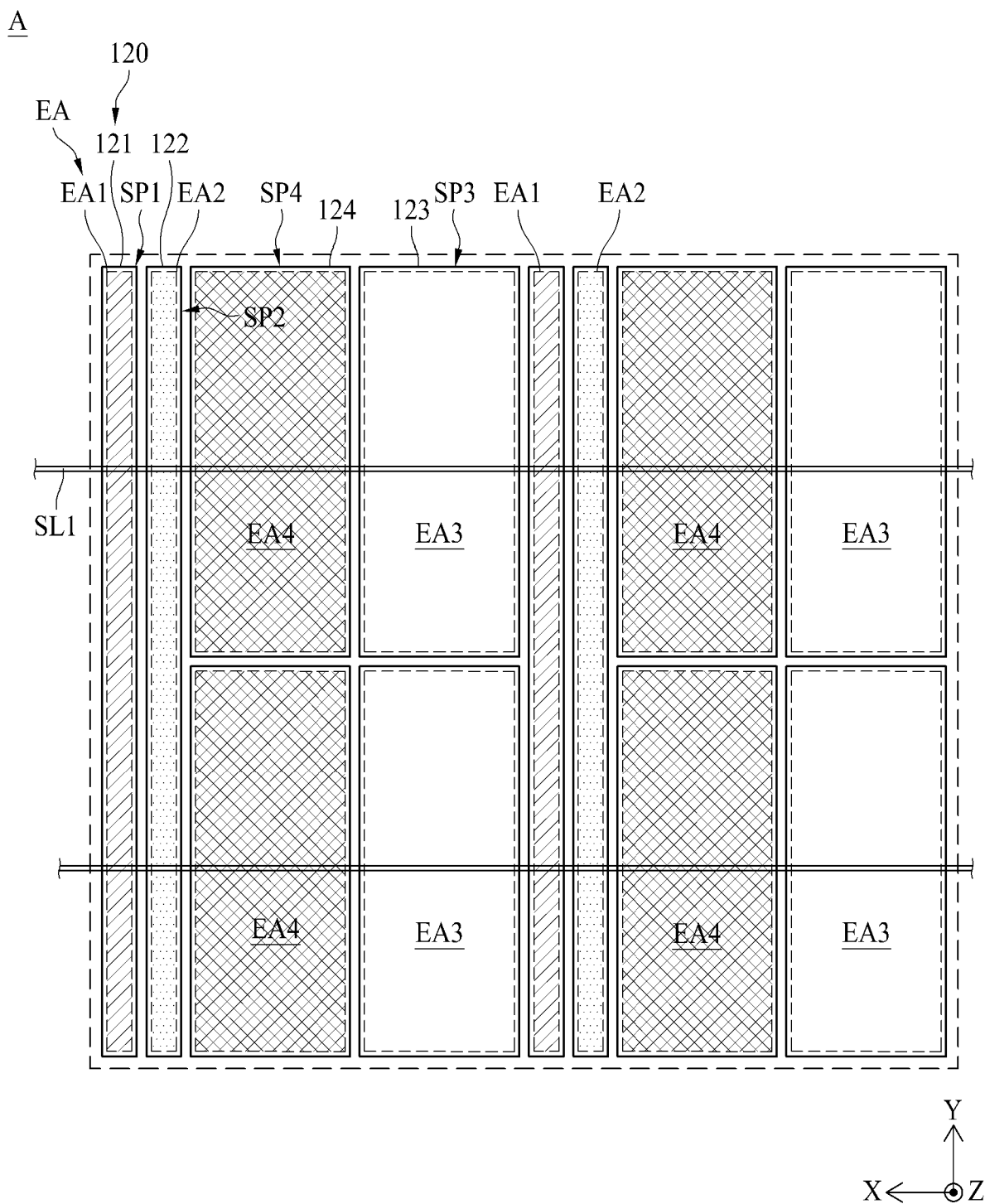
FIG. 9 is an enlarged view illustrating other example of an area A in FIG. 2.

FIG. 9 is an enlarged view illustrating other example of an area A in FIG. 2.

The general display device shown in FIG. 9 does not include a transmissive area TA, and each of the first pixel P1 and the second pixel P2 adjacent to each other in the second direction (e.g., Y-axis direction) may include four first to fourth subpixels SP1, SP2, SP3 and SP4. At this time, the first pixel P1 and the second pixel P2 may share at least two of the first to fourth subpixels SP1, SP2, SP3 and SP4, for example, the first subpixel SP1 and the second subpixel SP2.

According to the present disclosure, the following advantageous effects may be obtained.

In the present disclosure, the first and second pixels adjacent to each other share at least two subpixels, whereby the number of subpixels per two pixels may be reduced beneficially. Therefore, the present disclosure may increase the size of the transmissive area, thereby improving transparency.

In addition, in the present disclosure, at least two subpixels shared by the adjacent first and second pixels are longitudinally formed from the first pixel to the second pixel, whereby a mosaic pattern may be prevented from being generated, and image quality may be improved.

In addition, in the present disclosure, the anode electrode of each of at least two subpixels longitudinally formed from the first pixel to the second pixel is provided to overlap the driving transistor of the corresponding subpixel, whereby luminance of at least two subpixels may be prevented from being changed by capacitive coupling.

It will be apparent to those skilled in the art that the present disclosure described above is not limited by the above-described embodiments and the accompanying drawings and that various substitutions, modifications and variations can be made in the present disclosure without departing from the spirit or scope of the disclosures.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
 a substrate having transmissive areas and a non-transmissive area, the non-transmissive area disposed between the transmissive areas;
 a first pixel in the non-transmissive area, the first pixel including a first subpixel, a second subpixel and a third subpixel; and
 a second pixel adjacent to the first pixel in the non-transmissive area, the second pixel including a first subpixel, a second subpixel, and a third subpixel,
 wherein the first pixel and the second pixel share the first subpixel and the second subpixel,
 wherein each of the first subpixel and the second subpixel includes:
 a first driving transistor and a second driving transistor, the first driving transistor and the second driving transistor each positioned on the substrate;

a first electrode on each of the first and second driving transistors;
a light emitting layer on the first electrode; and
a second electrode on the light emitting layer,
wherein the first driving transistor is coupled with the first electrode of the first subpixel by being overlapped with at least a portion of the first electrode of the first subpixel, and the second driving transistor is coupled with the first electrode of the second subpixel by being overlapped with at least a portion of the first electrode of the second subpixel.

2. The display device of claim 1, wherein each of the first and second driving transistors includes an active layer, a gate electrode, a source electrode and a drain electrode,
wherein the gate electrode of the first driving transistor overlaps at least a portion of the first electrode of the first subpixel, and
wherein the gate electrode of the second driving transistor overlaps at least a portion of the first electrode of the second subpixel.

3. The display device of claim 1, further comprising:
a first signal line extended in a first direction; and
a second signal line extended in a second direction,
wherein each of the first pixel and the second pixel is disposed in an area where the first signal line and the second signal line overlap each other.

4. The display device of claim 3, wherein the first pixel and the second pixel are adjacent to each other in the second direction, and the first subpixel and the second subpixel, which are shared by the first pixel and the second pixel, are adjacent to each other in the first direction.

5. The display device of claim 3, wherein
the first subpixel includes:
a first transistor area provided with a first driving transistor, and
a first signal line area provided with the second signal line, and
the second subpixel includes:
a second transistor area provided with a second driving transistor, and
a second signal line area provided with the second signal line.

6. The display device of claim 5, wherein the first signal line area is positioned relative the first transistor area along the second direction, and the second signal line area is is positioned relative the first transistor area along the first direction.

7. The display device of claim 5, wherein the second transistor area is disposed relative the first signal line area along the first direction.

8. The display device of claim 3, wherein the second signal line includes at least one of a data line, a pixel power line or a common power line.

9. The display device of claim 3, wherein the second signal line alternately passes through the first subpixel and the second subpixel.

10. The display device of claim 1, wherein one of the first subpixel and the second subpixel is a red subpixel emitting red light, and the other one of the first subpixel and the second subpixel is a blue subpixel emitting blue light.

11. A display device comprising:
a substrate provided with transmissive areas and a non-transmissive area disposed between the transmissive areas;
a first scan line and a second scan line, the first scan line and the second scan line extended in a first direction and spaced apart from each other by at least one transmissive area of the transmissive areas;
a first power line and a second power line, the first power line and the second power line extended in a second direction and spaced apart from each other by at least one transmissive area of the transmissive areas;
a first pixel provided in an area of overlap of the first scan line and the first power line, the first pixel including a first subpixel, a second subpixel and a third subpixel; and
a second pixel provided in an area of overlap of the second scan line and the first power line, the second pixel including a first subpixel, a second subpixel and a third subpixel,
wherein the first pixel and the second pixel share the first subpixel, and share the second subpixel, and
wherein each of the first power line and the second power line alternately pass through the first subpixel and the second subpixel.

12. The display device of claim 11, wherein the first subpixel and the second subpixel are adjacent to each other in the first direction, have a length in the second direction and have a width in the first direction, the length being greater than the width.

13. The display device of claim 11, wherein each of the first subpixel and the second subpixel has a width in the first direction narrower than that of the third subpixel, and has a width in the second direction wider than that of the third subpixel.

14. The display device of claim 13, wherein each of the first subpixel and the second subpixel has a width in the second direction wider than that of the third subpixel by a multiple greater than about 2.

15. The display device of claim 13, wherein each of the first pixel and the second pixel further includes a fourth subpixel, and each of the first subpixel and the second subpixel has a width in the second direction greater than a sum of a width in the second direction of the third subpixel and a width in a second direction of the fourth subpixel by a multiple greater than about 2.

16. The display device of claim 11, wherein the first power line and the second power line are one of a pixel power line and a common power line.

17. The display device of claim 11, wherein each of the first subpixel and the second subpixel overlaps at least a portion of each of the first scan line and the second scan line.

18. The display device of claim 11, wherein the first subpixel includes a first transistor area provided with a first driving transistor and a first signal line area provided with a second signal line, and
the second subpixel includes a second transistor area provided with a second driving transistor and a second signal line area provided with the second signal line.

19. The display device of claim 18, wherein the first signal line area is disposed adjacent the first transistor area along the second direction, and the second signal line is disposed adjacent the first transistor area along the first direction.

20. The display device of claim 18, wherein each of the first subpixel and the second subpixel includes:
a first electrode provided on the substrate;
a light emitting layer provided on the first electrode; and
a second electrode disposed on the light emitting layer,
wherein the first driving transistor is coupled with the first electrode of the first subpixel by being overlapped with at least a portion of the first electrode of the first subpixel, and the second driving transistor is coupled with the first electrode of the second subpixel by being overlapped with at least a portion of the first electrode of the second subpixel.

* * * * *